United States Patent [19]
Girardeau, Jr. et al.

[11] Patent Number: 5,731,769
[45] Date of Patent: Mar. 24, 1998

[54] MULTI-RATE DIGITAL FILTER APPARATUS AND METHOD FOR SIGMA-DELTA CONVERSION PROCESSES

[75] Inventors: James W. Girardeau, Jr.; David Yatim, both of Austin, Tex.

[73] Assignee: Motorola, Inc., Schaumburg, Ill.

[21] Appl. No.: 566,639

[22] Filed: Dec. 4, 1995

[51] Int. Cl.$^6$ .................................................. H03M 7/00
[52] U.S. Cl. ............................... 341/61; 364/724.01
[58] Field of Search .................. 341/50, 61; 364/724.01

[56] References Cited

U.S. PATENT DOCUMENTS

| | | | |
|---|---|---|---|
| 4,999,798 | 3/1991 | McCaslin et al. | 364/724.1 |
| 5,079,734 | 1/1992 | Riley | 364/724.1 |
| 5,541,600 | 7/1996 | Krantz et al. | 341/139 |

OTHER PUBLICATIONS

Multirate Filter Designs using Comb Filters Chu et al. IEEE Trans vol. CAS-31 pp. 913-924 Nov. 1984.

*Primary Examiner*—Marc S. Hoff
*Assistant Examiner*—Peguy Jean Pierre

[57] ABSTRACT

Data converter (10, 50, 150, 200) and method (250, 300) operate at variable sampling rates. Input gain stage (12) adjusts input bit stream (18) at an input bit rate (20) to produce gain adjusted bit stream (22). Integrator (14) and comb filter (16) operate on the gain adjusted bit stream (22) to produce a filtered bit stream (28) at an output bit rate (24). The gain of the integrator (14) and comb filter (16) pair varies with the sampling rates implemented. An input gain value of the input gain stage (12) adjusts to compensate for the gain of the integrator (14) and comb filter (16) pair to produce the filtered bit stream (28) within a predetermined dynamic range. DC offset stage (52) and output gain stage (54) provide further adjustment to the filtered bit stream (28). Data converters (10, 50) and method (250) convert data from a higher frequency bit rate to a lower frequency bit rate. Data converters (150, 200) and method (300) convert data from a lower frequency bit rate to a higher frequency bit rate.

31 Claims, 6 Drawing Sheets

MULTI-RATE DIGITAL FILTER APPARATUS AND METHOD FOR SIGMA-DELTA CONVERSION PROCESSES

TECHNICAL FIELD OF THE INVENTION

This invention relates generally to the conversion of signals and more particularly to an improved data converter and method of operation that provides multiple sampling rates and produces an output within a desired dynamic range.

BACKGROUND OF THE INVENTION

The conversion of signals between an analog format and a digital format has been known in the art in the years. In various applications, such as in telephone systems, signals are operated upon primarily when the signals are in a digital format. In the digital format, the signals may be manipulated using digital data processing components to achieve system performance that was not readily achievable using analog components and operating on an analog signal. Thus, many systems that previously operated only on analog data now employ digital techniques to achieve system goals operating upon digital signals.

In most digital systems, the accurate representation and reproduction of signals of interest is of utmost importance. In the case of a digital telephone system, for example, an analog signal is received from a first user, converted to a digital signal, transmitted digitally, received digitally, converted to an analog signal, and provided to a second user in an analog format. Not only must the digital representation of the analog signal be accurate, but an accurate analog representation of the digital signal must also be created. Thus, the conversion of signals between the analog format and the digital format is an important and integral process in digital communication systems such as the digital telephone system.

The sigma-delta conversion process has gained great popularity as a technique to accurately convert signals from an analog format to a digital format and from a digital format to an analog format. As a first step, an analog-to-digital (A/D) sigma-delta converter samples an analog signal at a sampling frequency, and converts the analog signal to a digital bit stream output representing the analog signal at the sampling frequency. Generally, sigma-delta converters operate at sampling frequencies that are a multiple of the highest frequency of interest of the analog signal. The technique of sampling an analog signal at a high frequency relative to the highest frequency of interest is called oversampling.

The technique of oversampling is performed because it pushes quantization noise introduced in the sampling process to a portion of the frequency spectrum beyond the highest frequency of interest. In other types of signal conversion processes, quantization noise introduced in the sampling process is substantially constant across the frequency spectrum, including a frequency band of interest. Thus, the sigma-delta process provides the important benefit of substantially separating the frequency of interest from a large portion of the quantization noise along the frequency spectrum. By using standard filtering techniques, the quantization noise may be substantially removed from the converted analog signal while minimally disrupting the signal of interest.

A typical frequency band of interest in an audio system is 0 kilohertz to 20 kilohertz, the audible range of a human listener. In many telephone applications, however, a typical frequency band of interest is 0 kilohertz to 4 kilohertz, a typical voice signal frequency range. By converting analog voice signals to digital voice signals using a sigma-delta converter at a sampling frequency of approximately one megahertz, significant quantization noise is moved out onto the frequency spectrum far beyond the frequency of interest. Once converted, the signal may be low pass filtered to remove the quantization noise.

The oversampling ratio is typically referred to as the ratio of the sampling rate to the output data rate. Common sampling rates are 960 kilohertz, 1.02 megahertz and 1.152 megahertz. Common output rates are 8 kilohertz and 16 kilohertz. Because the signal to noise ratio of the data conversion process is directly related to the oversampling ratio, the oversampling ratio chosen for a particular application must be large enough to meet the signal to noise requirements of the given application. However, as the oversampling ratio and sampling rate increase, the cost of other system components also increases and the power consumption of the converter increases. Thus, the sampling rate is typically selected to be as low as possible but sufficient to satisfy system performance requirements.

In a typical sigma-delta modulating analog-to-digital (A/D) converter, an analog input signal is oversampled at the input sampling rate to produce a single bit representation of the signal at the sampling rate. The single bit representation at the sampling rate is then converted into a multiple bit representation at a lower sampling rate using a cascaded integrator comb ("CIC block") which includes an integrator and a comb filter. The integrator, which may include multiple stages (order), receives the input bit stream at the input sampling rate and produces a multiple bit integrated output at an output sampling rate. The comb filter receives the integrated output from the integrator and comb filters the integrated output to produce a filtered signal. In combination, the integrator and comb filter perform the decimation function and low pass filtering function on the input bit stream. Thus, the CIC block effectively converts a digital signal from a higher sampling frequency signal with fewer bits per sample to a lower sampling frequency signal having a greater number of bits per sample and removes substantially all of the quantization noise and alias noise from the signal.

The gain of the CIC block of the A/D converter is equal to the oversampling ratio taken to the power of the order, or number of stages, of the integrator implemented. The oversampling ratio of the A/D converter is equal to the input sampling frequency divided by the output data rate. When the oversampling ratio is 64 and the integrator is a third order integrator, for example, the gain of the CIC block will be $64^{**3}$ or 64 cubed. The gain of the CIC block causes problems in the signal conversion process. Because signal processors implementing the data conversion process have a finite number of bits to represent the digitized signal, a particular oversampling ratio may cause underflow or overflow within the processing system. Thus, typical prior art data converters used a fixed oversampling ratio and constructed the CIC block to prevent underflow and overflow.

In many applications, however, it is desirable to provide a variable oversampling ratio so that the converter may be adjusted to achieve varying design goals from installation to installation. One prior art solution to providing a variable oversampling rate converter was to include a wide data bus in the converter and in all associated components so that the system would have sufficient dynamic range for all situations. However, the cost of the implementation of the wider converter and the modification of system components required to operate with the wider converter significantly increased system costs.

Thus, there is the need in the art for a data converter that has a variable sampling rate but that produces output data within a predetermined output range.

DETAILED DESCRIPTION OF THE DRAWINGS

The present invention relates to a data converter and associated method of operation. The data converter operates at a variable sampling rate but produces output within a predetermined dynamic range. Based upon the sampling rate, the converter adjusts the gain of an input bit stream such that output data produced by the data converter is within the predetermined dynamic range. Based on the adjustment of the input data, various oversampling ratios based upon the various sampling rates may be implemented by the data converter such that the data converter may be customized to a particular application but with a standard data width. In this fashion, the oversampling ratio may be adjusted within the data converter to achieve desired signal to noise system performance.

Figure 1:
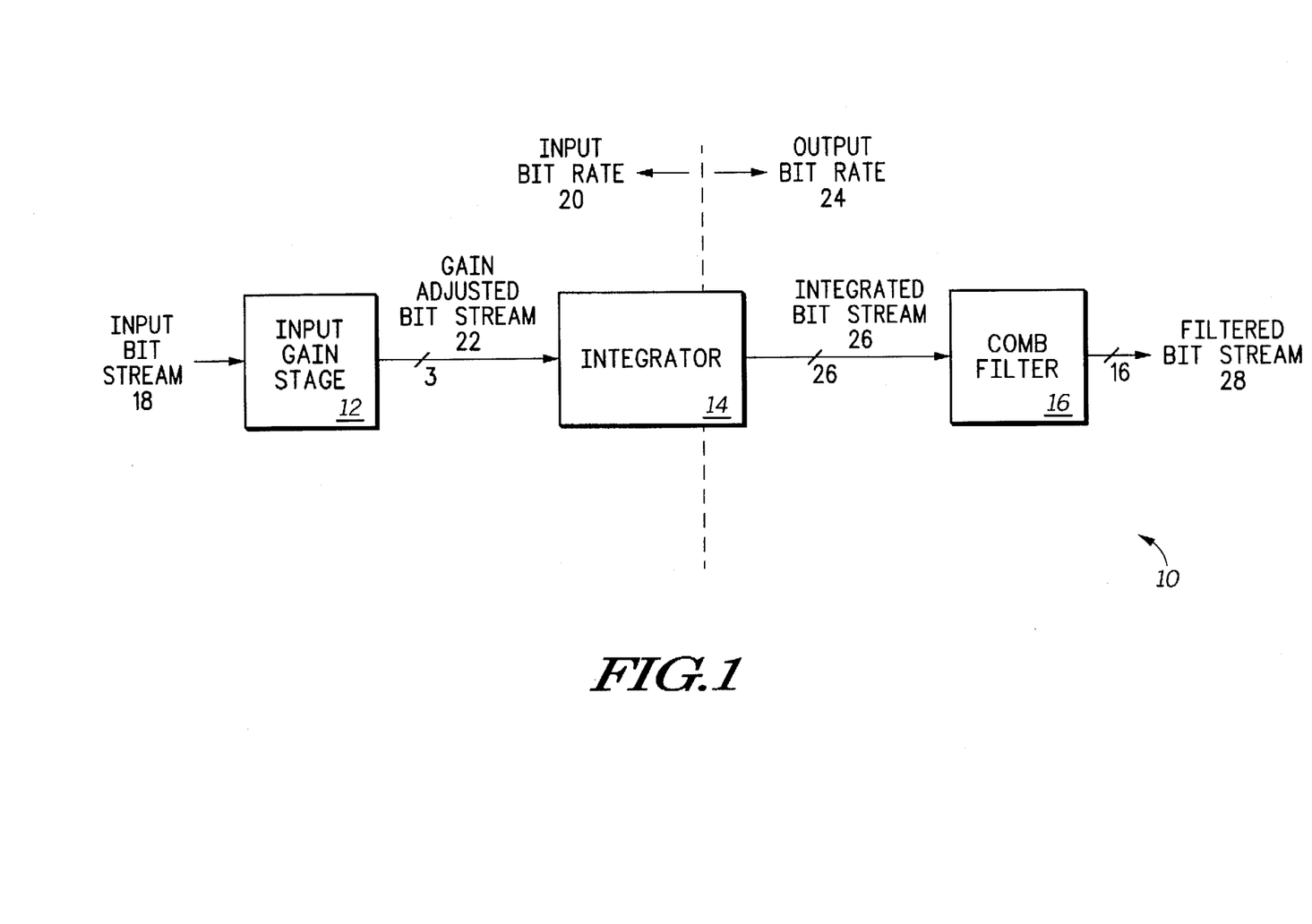
FIG. 1 is a block diagram illustrating a data converter in accordance with the present invention.

FIG. 1 illustrates a data converter 10 having a variable sampling rate. The data converter 10 comprises an input gain stage 12, an integrator 14, and a comb filter 16. The components work in conjunction with one another to produce an output that will be produced within a predetermined dynamic range independent of the oversampling ratio of the data converter 10.

The input gain stage 12 receives an input bit stream 18 at an input bit rate 20 and adjusts the input bit stream 18 by an input gain value to produce a gain adjusted bit stream 22 at the input bit rate 20. The input bit stream 18 is preferably a single bit wide with its value either a logical 1 or a logical 0 and represents arbitrary data values. Based upon an assignment, a logical 1 may represent a positive value while a logical 0 represents a negative value. Alternatively, a logical 1 may represent a positive value while a logical 0 represents a zero value. Such assignments are made by a system designer employing the data converter 10 in a particular system based upon system constraints.

The input gain value of the input gain stage 12 is at least partially based on the input bit rate 20 and, resultantly, is related to the oversampling ratio of the converter 10. It is desirous to have a oversampling ratio that is sufficient to achieve a minimum signal to noise ratio in the signal conversion process. Further, it is desirable to employ an oversampling ratio that does not exceed the sufficient oversampling ratio to minimize power consumption and complexity of the components within the system that includes the data converter 10. Thus, the data converter 10 of the present invention provides a variable sampling rate, which is the input bit rate 20. Preferably, an output bit rate 24 is fixed such that a variation in the input bit rate 20 solely alters the oversampling ratio of the data converter 10. Thus, the input bit rate 20 of the data converter 10 will be varied to achieve differing system requirements in differing systems.

The integrator 14 operably couples to the input gain stage 12 and receives the gain adjusted bit stream 22. The integrator 14 samples the gain adjusted bit stream 22 at the input bit rate 20 and produces an integrated bit stream 26 at the input bit rate 20. A transfer function of the integrator 14 has a pole at zero and a tapered response to zero as frequency increases. Thus, the integrator 14 shapes the gain adjusted bit stream 22 as it produces the integrated bit stream 26 and removes a significant portion of the quantization noise from the gain adjusted bit stream 22.

The comb filter 16 operably couples to the integrator 14 and receives the integrated bit stream 26 from the integrator 14. The comb filter 16 comb filters the integrated bit stream 26 to produce a filtered bit stream 28 at an output bit rate 24. A comb filtering function has a zero at zero hertz and a zero at each multiple of the comb frequency. Thus, the zero of the comb filter 16 at zero hertz combines with the pole of the integrator 14 transfer of function at zero combine to produce a substantially unity transfer function at zero hertz and near zero hertz to allow the signal of interest to pass while removing quantization noise. Further, the zeros of the comb filter 16 at the multiples of the sampling frequency substantially removes the aliases created in the decimation process. Thus, the CIC block formed by the integrator 14 and comb filter 16 operate to remove quantization noise, decimate, and filter the gain adjusted bit stream 22 to produce a filtered bit stream 28 at a lower bit rate and higher bit per sample representation.

Preferably, the input gain stage 12 and the integrator 14 are integrated in hardware while the comb filter 16 is implemented in software using a data processor or the like. However, the teachings of the present invention are not limited by the embodiment described herein and relate to any variable rate data converter 10 that produces output data that lies within a predetermined dynamic range.

Preferably, the input bit rate 20 is 960 kilohertz, 1.024 megahertz or 1.152 megahertz. However, other input bit rates 20 may be chosen. The output bit rate 24 is preferably 8 kilohertz or 16 kilohertz with a 16 bit width, but could be another data sampling rate as well. Thus, the oversampling ratio of the data converter 10 preferably ranges from 60 to 144. The range of oversampling ratios preferably available with the data converter 10 of the present invention provides a designer with sufficient choices in converter performance to allow the data converter 10 to be used in various applications while satisfying various system performance criteria.

The input gain stage 12 is preferably constructed such that it adjusts the input bit stream 18 by a gain of 1, 2, or 4. However, such gain adjustment will depend upon the order of the integrator 14, the output bit rate 24, and the input bit rate 18. As previously described, the input gain value of the input gain stage 12 is selected to cause the output of the data converter 10 to reside within a predetermined dynamic range. Thus, the input gain value will depend upon these other components as well as the width of the output of the converter 10.

Thus, the data converter 10 of the present invention provides the important benefit of operating at for a variety of sampling rates and yet producing a filtered bit stream 28 that lies within a predetermined range. The data width associated with the data converter 10 is minimized so that the cost and complexity is reduced while performance achieved by the data converter 10 is maximized. By providing for variable sampling rate operation, the data converter 10 of the present invention provides significant flexibility and performance. Further, by producing output data within a given dynamic range, the data converter 10 may be used with standard system components at a reduced cost. Thus, the data converter 10 of the present invention provides the important benefits of cost reduction and complexity reduction as compared to prior devices.

Figure 2:
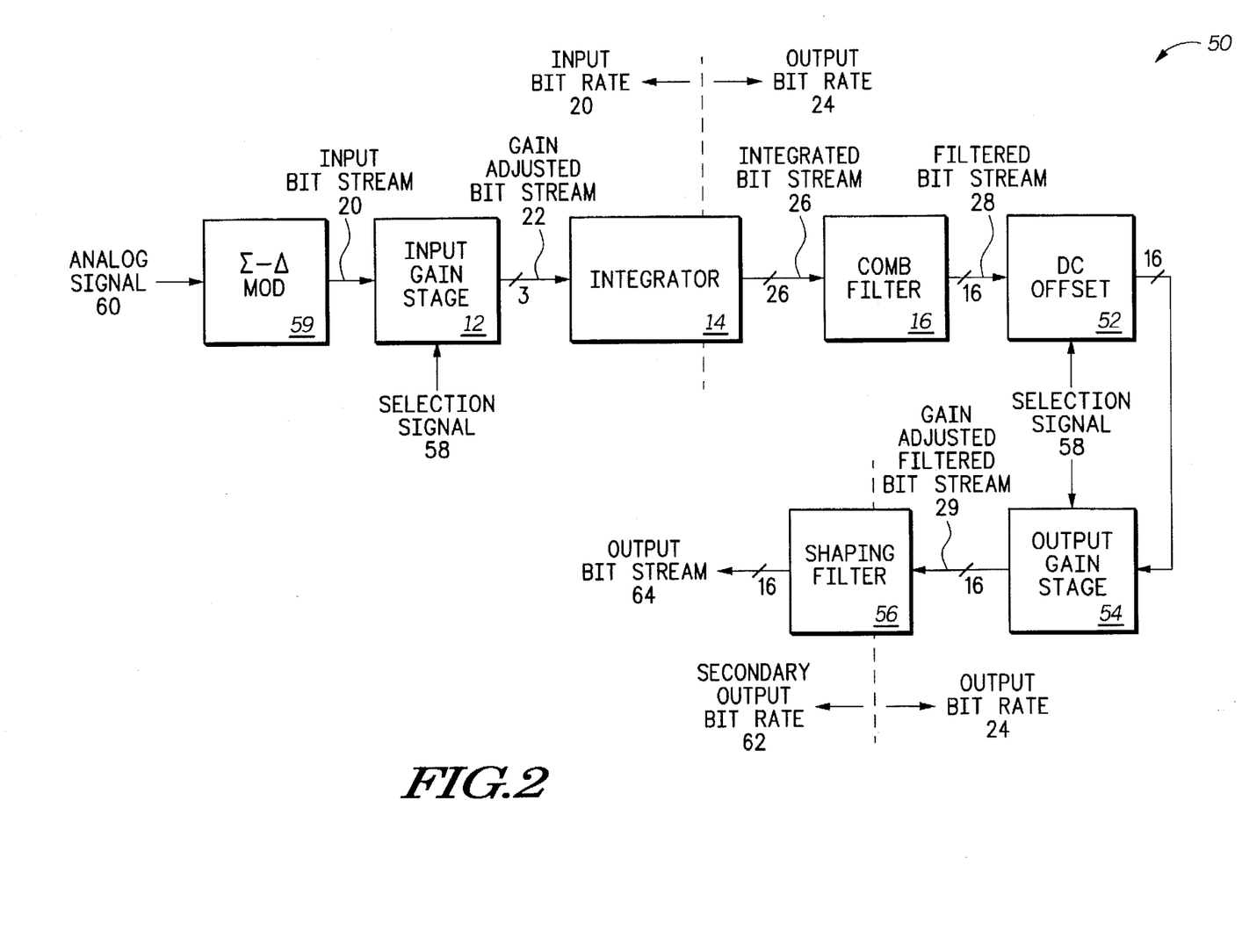
FIG. 2 is a block diagram illustrating an alternative embodiment of a data converter in accordance with the present invention.

FIG. 2 illustrates a data converter 50 having a variable sampling rate in accordance with the present invention. Numbering conventions established in FIG. 1 for common elements are retained in FIG. 2. The data converter 50 preferably comprises an input gain stage 12, an integrator 14, comb filter 16 and also comprises a DC offset stage 52, an output gain stage 54, a shaping filter 56, and a sigma delta modulator 58. The integrator 14 and comb filter 16 functions are identical to the embodiment described in FIG. 1 and the components will not be further described herein in conjunction with FIG. 2.

The sigma-delta modulator 59 receives an analog signal 60 and sigma-delta modulates the analog signal 60 to produce the input bit stream 20. The sigma-delta modulator 59 samples the analog signal 60 at the input bit rate 20 to produce the input bit stream 20 at the input bit rate. The sigma-delta modulator 59 preferably comprises a structure as is known in the art and will not be further described herein.

The input gain stage 12 performs an identical function as was previously described in accordance with FIG. 1. However, the input gain stage 12 shown in FIG. 2 also receives a selecting signal 58 that is based upon the sampling rate or input bit rate 20 of the data converter 50. As was previously described, when the output bit rate 24 is fixed, the input bit rate 20 determines the oversampling ratio of the data converter 50 and resultantly the gain of the CIC block. By varying the selecting signal 58 based upon the oversampling ratio, or the input bit rate 20, the input gain stage 12 selectively adjusts the input bit stream 20 to produce the gain adjusted bit stream 22.

The input gain stage 12 provides only a first adjustment to the input bit stream 20, however. Thus, the DC offset stage and the output gain stage 54 also provide adjustments to cause the output bit stream 64 to reside within the predetermined dynamic range.

The DC offset stage 52 operably couples between the comb filter 16 and the signal shaping filter 56. The DC offset stage 52 substantially removes a DC component from the filtered bit stream 28 wherein the DC component is at least partially based on the input bit rate 20. As created by the sigma-delta modulator 59, the input bit stream 20 represents the analog signal 60 as converted. Based upon the assumptions made in the conversion process and the representation of the analog signal by the input bit stream 20, the input bit stream 20 may inherently include a DC offset. Such would be the case, for example, when an input bit stream 20 logical 1 represents a value of 1 while a logical 0 represents a value of 0. In this situation, there would be a value of 0.5 as a DC offset. In other situations, based upon the representation of the input bit stream 20, differing DC offset values will be produced in the input bit stream 20.

The representation of the input bit stream 20 as described reduces the complexity of components of the data converter 50, particularly the input stage of the integrator 14. However, because a DC offset exists in the input bit stream 20, the DC offset is amplified by the input gain stage 12 and the gain of the CIC block an becomes a component of the filtered bit stream 28. Thus, the amplified DC offset must be removed by the DC offset stage 52. The selecting signal 58, which is preferably based on the oversampling ratio, signals the DC offset stage 52 to remove a particular DC from the filtered bit stream. The selecting signal provided to the DC offset stage 52 may also be based upon other assumptions as relating to the creation of the DC offset in the conversion process. In summary, the DC offset stage 52 removes a DC offset from the input bit stream 20 to guarantee that the filtered bit stream 28 remains within the predetermined dynamic range.

The output gain stage 54 operably couples to the DC offset stage 52 and adjusts the magnitude of the filtered bit stream 28 by an output gain value. The output gain value is at least partially based on the input bit rate 20. In the embodiment of the data converter 50 of FIG. 2, the input gain stage 12 is a coarse gain adjuster that may alter the input bit stream 20 by gain factors of two. Thus, the output gain stage 54 provides a finer adjustment, based on the sample rate, to adjust the filtered bit stream 28 to cause the filtered bit stream 28 to reside in the predetermined dynamic range. Thus, in combination, the input gain stage 12, the DC offset stage 52, and the output gain stage 54 adjust the converted signals provided by the data converter 50 to cause the filtered bit stream 28 to reside in the predetermined dynamic range.

The shaping filter 56 receives filtered bit stream 28 from the output gain stage 54 and spectrally shapes the filtered bit stream 28 to produce an output bit stream 64 conforming with spectrum requirements. Preferably, the shaping filter 56 produces the output bit stream at a secondary output bit rate 62 at a lower frequency than the output bit rate 24. The input gain stage 12, the CIC block, the DC offset stage 52, and the output gain stage 54 create the gain adjusted filtered bit stream 29 having a certain spectral shape. The shaping filter 56 adjusts the spectrum of the filtered bit stream 28 as desired to produce the output bit stream 64. Based on the particular requirements in which the data converter 50 resides, the shaping filter characteristics 56 will be determined.

Thus, the data converter 50 of FIG. 2 provides the additional benefits of removing DC offset from the filtered bit stream 28 and gain adjusting the filtered bit stream 28 to correspond finally to the predetermined dynamic range. Thus, the data converter illustrated in FIG. 2 may operate in any of the various oversampling rates provided having the various input bit rates 20 to satisfy system requirements in which the data converter 50 is installed. The data converter 50 then operates at the desired input bit rate 20 sampling ratio and yet still provides an output bit stream 64 within the predetermined dynamic range at the predetermined secondary output bit rate 62.

Figure 3:
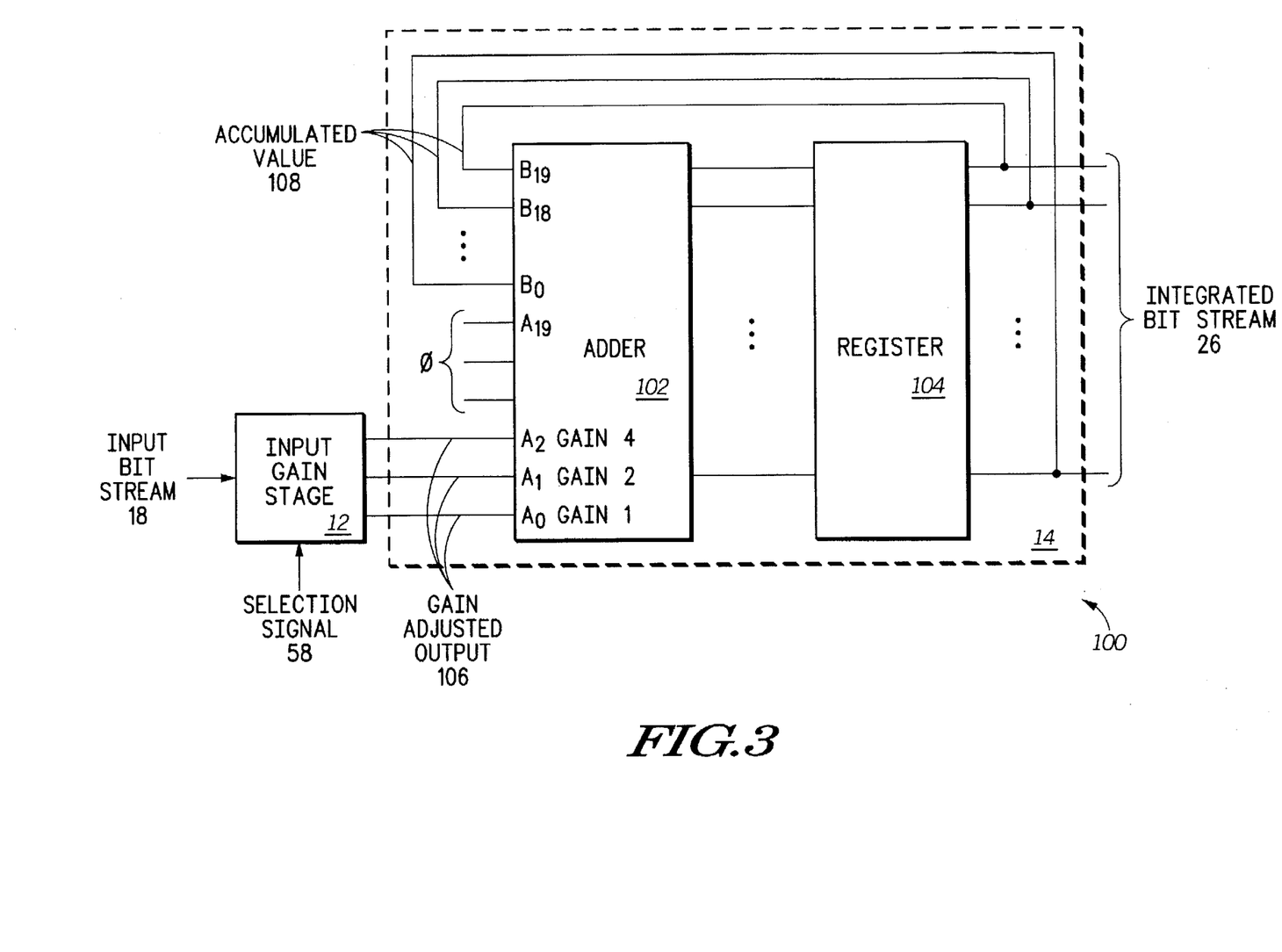
FIG. 3 is a block diagram illustrating an input gain stage implementation in accordance with the present invention.

FIG. 3 illustrates a particular embodiment 100 of the input gain stage 12 and integrator 14 of the data converters 10 and 50 of FIGS. 1 and 2, respectively. The input bit stream 18 is provided to the input gain stage 12 which produces a gain adjusted output 106. The integrator 14 comprises a multiple bit adder 102 and a multiple register 104 interoperably coupled to provide an accumulation function. The output of the register 104 is provided as one of the inputs to the adder 102. The input to the adder 102 from the register 104 is represented as bits B0–B19 and is deemed the accumulated value 108. The gain adjusted output 106 from the input gain stage 12 is the second input to the adder 102. These inputs are denoted as A0–A19. Based upon the selection signal 58 the input gain stage 12 provides the input bit stream 18 to inputs A0, A1, or A2 of the adder 102.

Thus, the input gain stage 12 in this particular embodiment operates in one of three modes. In the first mode, the selection signal 58 provided at the input gain stage, causes a gain of 1. In this case, the input bit stream 18 which is a single bit representation is provided to A0 of the adder 102. In a second mode, the input bit stream 18 is provided to input A1 of the adder 102. Providing the input bit stream to input A1 is equivalent to a gain of 2. In a third mode of operation, the input gain stage 12 provides the input bit stream 18 to input bit A2 of adder 102. By providing the input bit stream 18 to this input, the input gain stage 12 has effectively caused a gain of 4. The particular bits provided as inputs A0–A2 that do not receive the input bit stream 18 are fixed at 0. Further, input bits A3–A19 are fixed at 0. Thus, on each operation of the adder 102 the input bit stream 18 is added to the accumulation component held in the register 104. By performing this accumulation function, the integrated bit stream 26 is produced.

Thus, the implementation 100 of FIG. 3 provides a simplified mechanism for performing a gain function by an input gain value. Since the input gain stage 12 and the integrator 14 provide this function digitally, preferably in hardware, it is easily implemented in accordance with the other digital elements in a typical data processing system.

Figure 4:
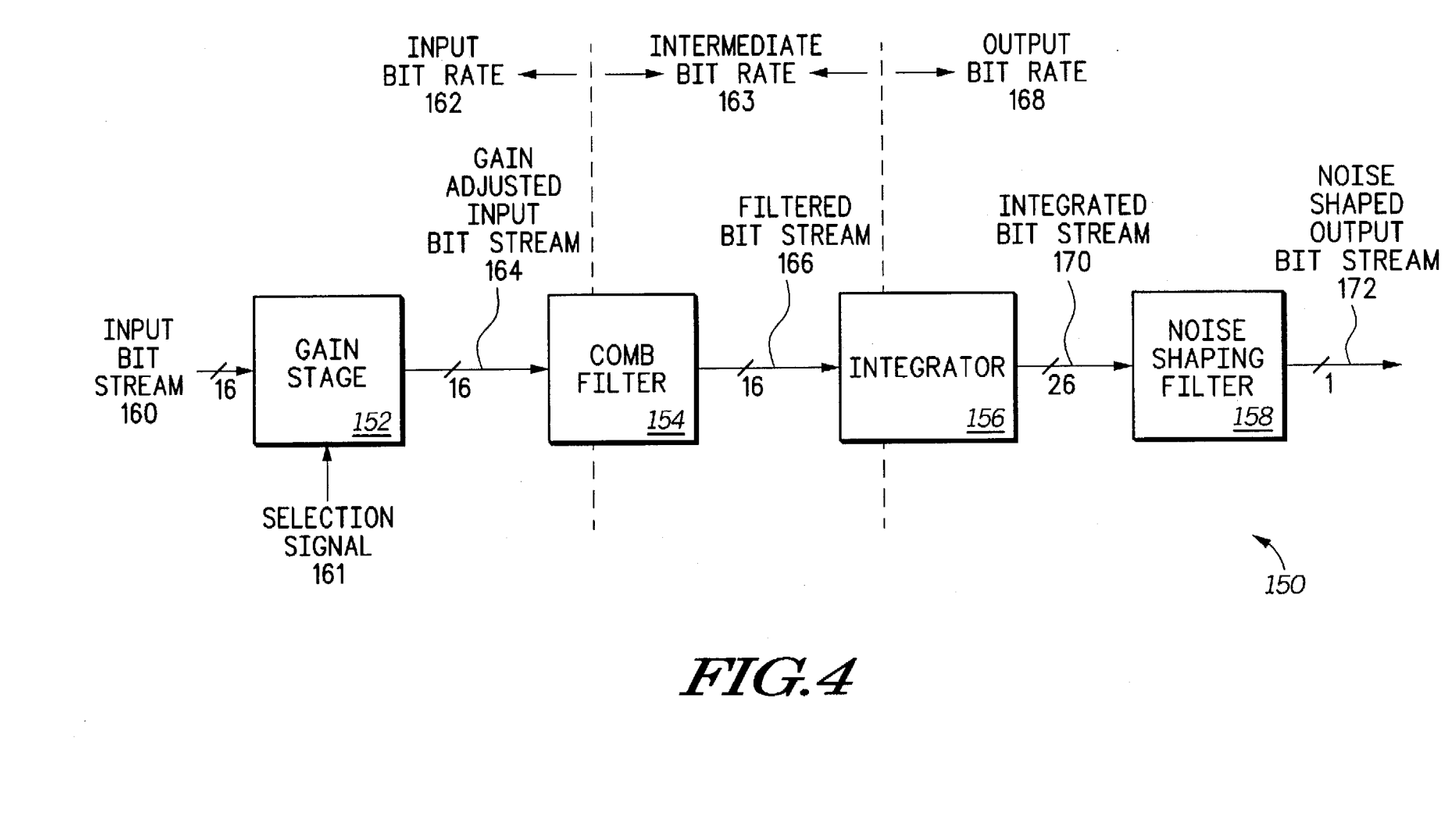
FIG. 4 is a block diagram illustrating an output data converter in accordance with the present invention.

FIG. 4 illustrates a data converter 150 having a variable sampling rate. The data converter comprises a gain stage 152, a comb filter 154, an integrator 156, and a noise shaping filter 158. preferably, the data converter 150 is an inverse representation of the data converter of 10 illustrated in FIG. 1. The data converter 150 converts an input bit stream 160 at an input bit rate 162 to a noise shaped output bit stream 172 at an output bit rate 168 that is at a much higher frequency than the input bit rate 162. However, the output bit rate 168 of the data converter 150 is variable so that the oversampling ratio associated with the data converter 150 is also variable and may be adjusted to comply with system performance requirements. The integrated bit stream 170 is produced such that it falls within a predetermined dynamic range such that the operation of the data converter 150 is analogous to the data converters 10 and 50 of FIGS. 1 and 2.

The gain stage 152 receives the input bit stream 160 at the input bit rate 162 and adjusts the input bit stream 160 based upon a selection signal 161 to produce a gain adjusted input bit stream 164 at the input bit rate 162. Preferably, the input bit stream 160 is at a data rate of 8 kilohertz and has a data width of 16 bits. However, the data rate could differ as could the data width. The gain stage 152 adjusts the input bit stream 160 by a gain value that is at least partially based on the output bit rate 168. As previously discussed, the gain of the CIC block in the data converter 150 is determined by the oversampling ratio. Thus, assuming that the input bit rate 162 is fixed, the gain value implemented by the gain stage 152 is determined by the output bit rate 168. The gain value is implemented by a selection signal 161, wherein the selection signal 161 is determined by the output bit rate 168. Thus, the selection signal causes the gain of the gain stage 152 to alter the gain value based upon the gain of the CIC block, or the oversampling ratio of the CIC block.

The comb filter 154 operably couples to the gain stage 152, receives the gain adjusted input bit stream 154 at an intermediate bit rate 163 and comb filters the gain adjusted bit stream 154 to produce a filtered bit stream 166 at the intermediate bit rate 163. Preferably, the filtered bit stream 166 is produced at the intermediate bit rate of 32 kilohertz and has a data width of 16 bits. Further, the comb filter 154 preferably comprises a type that is known in the art and has been previously described herein.

The integrator 156 samples the filtered bit stream 166 at the output bit rate 168 and produces an integrated bit stream 170 at the output bit rate 168. Preferably, the output bit rate is 960 kilohertz, 1.024 megahertz, or 1.152 megahertz and the integrated bit stream 170 has a data width of 20 bits. Thus, the integrator 156 samples the filtered bit stream 166 at a higher frequency than is produced by the comb filter 154. Sampling at a higher frequency is known in the art as interpolation and will not be further described herein. The integrator 156 integrates the filtered bit stream 166 to produce an integrated bit stream 170 at an output bit rate 168. An integration function, as implemented by the integrator 156, was previously described and will not be further described with reference to FIG. 4.

The noise shaping filter 158 operably couples to the integrator 156, receives the integrated bit stream 170, and produces a noise shaped output bit stream 172 at the output bit rate 168. Preferably, the noise shaped output bit stream has a data width of 1 bit. However, the data width could be wider depending upon the particular application.

The data converter 150 of FIG. 4 therefore allows for a variable output bit rate 168 and yet produces an integrated bit stream 170 that lies within a predetermined dynamic range. In this fashion, various oversampling ratios may be selected that will be implemented by the data converter 150. The oversampling ratio of the data converter 150 will be selected to provide a sufficient signal to noise ratio for the particular application. Thus, the data converter 150 provides the important benefit of providing variable output bit rates 168 with a minimized hardware structure. Such minimized hardware structure reduces costs, power consumptions and allows for reduced costs of associated components as well.

Figure 5:
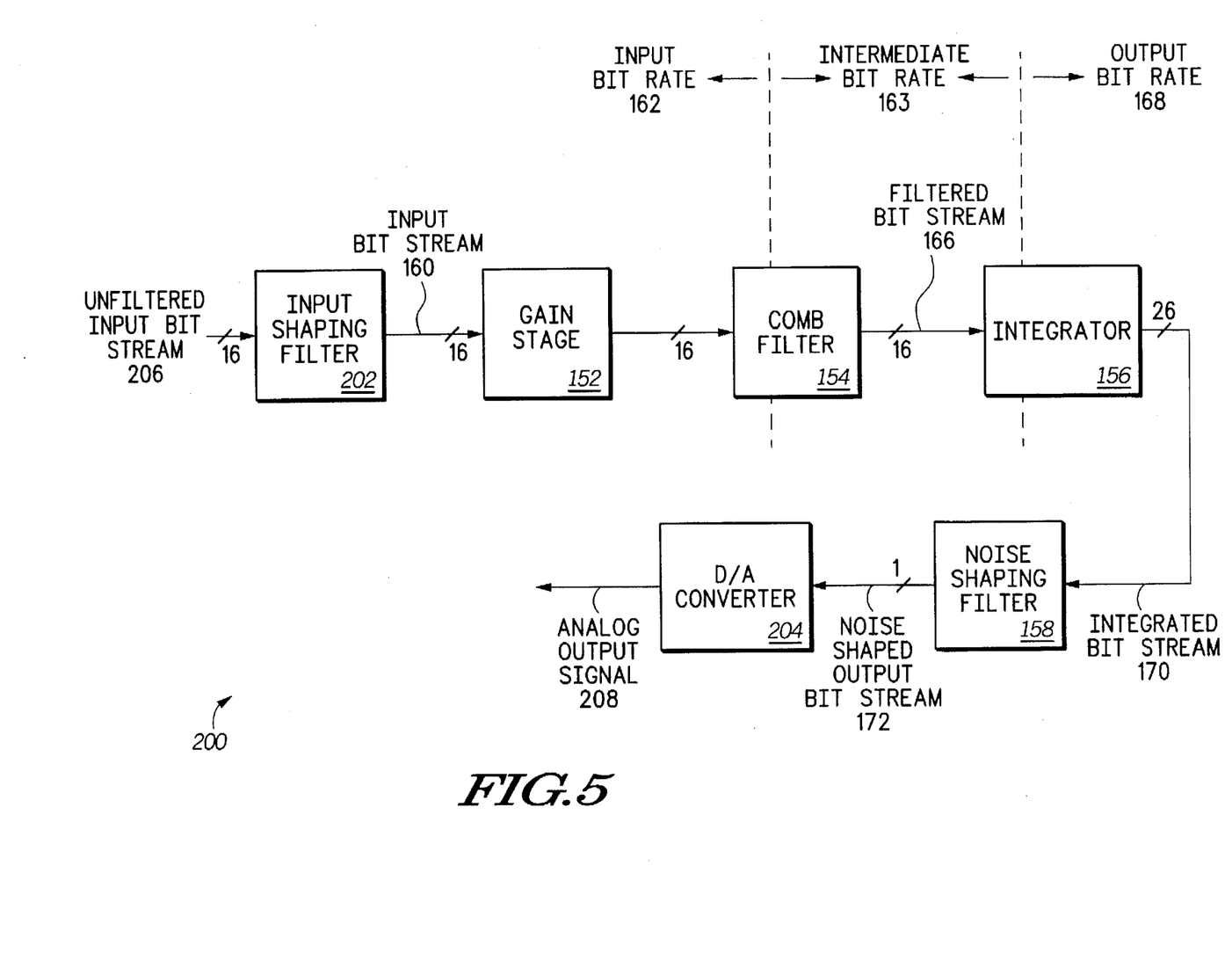
FIG. 5 is a block diagram illustrating an alternative embodiment of an output data converter in accordance with the present invention.

FIG. 5 illustrates a data converter 200 having a variable sampling rate in accordance with the present invention. The data converter 200 comprises elements common to data converter 150 of FIG. 4. Thus, the numbering convention of FIG. 4 will be retained in conjunction with the data converter 200 of FIG. 5. Common components amongst the embodiments include the gain stage 152, comb filter 154, integrator 156, and noise shaping filter 158. The functions of the gain stage 152, the comb filter 154, the integrator 156, and the noise shaping filter 158 have previously been described with reference to FIG. 4. Thus, their functions will not be further described herein with reference to FIG. 5 except to amplify the teachings of the present invention. The data converter 200 of FIG. 5 also includes an input filter 202 and digital to analog converter 204, components not included in the data converter 150 of FIG. 4.

Input shaping filter 202 receives an unfiltered input bit stream 206 and produces the input bit stream 160. The input filter 202 adjusts the spectrum of the unfiltered input bit stream 206 to produce the input bit stream 160. The spectrum is adjusted depending upon the spectral requirements of the application. The CIC block comprising the comb filter 154 and integrator 156 distorts the spectrum of a signal provided through the block. Thus, the input shaping filter 202 adjusts the spectrum of the bit stream to compensate for the spectral distortion caused by the CIC block. Particular applications require differing spectral shaping to satisfy spectral requirements. The input filter 202, therefore, performs spectral shaping consistent with the particular application. Thus, the input filter 202 provides both compensation for the CIC block and adjusts the spectrum for a particular application in which the data converter 200 is installed.

The digital to analog converter 204 receives the noise shaped output bit stream 172 and produces an analog output signal 208. Preferably, the noise shaped output bit stream 172 has a width of one bit such that the digital to analog converter 204 may be a single bit converter. However, the noise shaped output bit stream 172 could comprise more than a single bit width and a digital to analog converter 204 could be selected to provide the conversion function. Preferably, the digital to analog converter 204 includes a smoothing filter for removing quantization noise from the signal. As is known in the art, a typical smoothing filter would comprise a low pass filter that filters the higher frequency quantization noise from the analog output signal 208.

Thus, the data converter 200 of FIG. 5 provides the benefits of the data converter 150 of FIG. 4 along with the additional benefits of inputs shaping and digital to analog conversion. Therefore, the data converter 200 provides a complete digital to analog conversion process at a variable data rate, the data rate alterable for particular applications.

Figure 6:
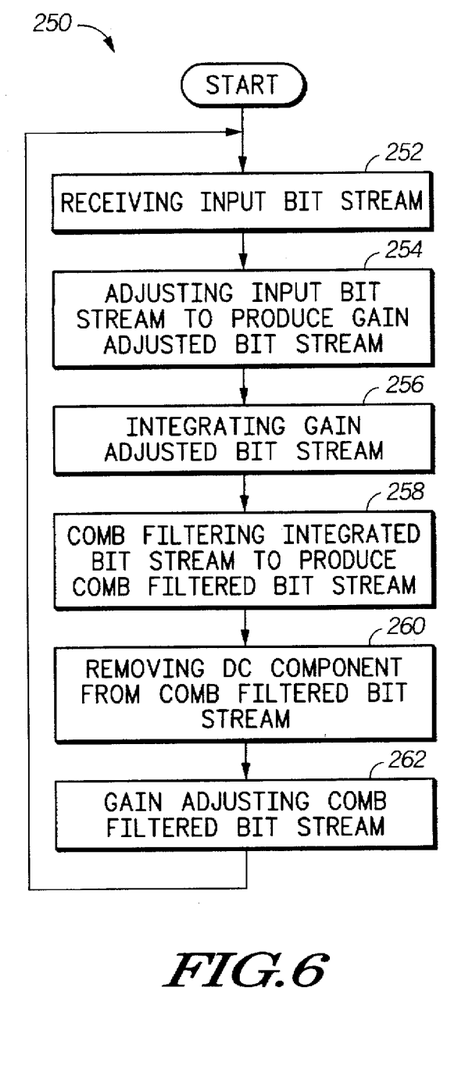
FIG. 6 is a logic diagram illustrating a method for converting data in accordance with the present invention.

FIG. 6 illustrates a method 250 for converting data at a variable sampling rate. The method includes as a first step 252 receiving an input bit stream at an input bit rate. In one embodiment, the input bit rate is representative of a digitally converted analog signal. Preferably, the input bit rate is 960 kilohertz, 1.024 megahertz, or 1.152 megahertz and the input bit stream has a data width of 1 bit. However, the input bit rate could comprise other frequencies and widths as well.

Next, at step 254, the method 250 includes adjusting the input bit stream based on an input gain value to produce a gain adjusted bit stream. The input gain value is at least partially based on the input bit rate. Next, at step 256, the method 250 includes integrating the gain adjusted bit stream to produce an integrated bit stream at an output bit rate which is less than the input bit rate. Next, at step 258, the method includes comb filtering the integrated bit stream to produce a comb filtered bit stream at the output bit rate. Then, at step 260, the method includes removing a DC component from the comb filtered bit stream. Next, step 262 includes gain adjusting in the comb filtered bit stream. The data rates associated with the method 250 of the present invention are consistent with the data converters 10 and 50 of the present invention and are not further described with reference to the method 250.

The benefits associated with the method 250 of the present invention are consistent with those of the data converters 10 and 50 of the present invention. Thus, the method 250 of the present invention provides for variable sampling rate modes of operation but that provides output data within a predetermined dynamic range.

Figure 7:
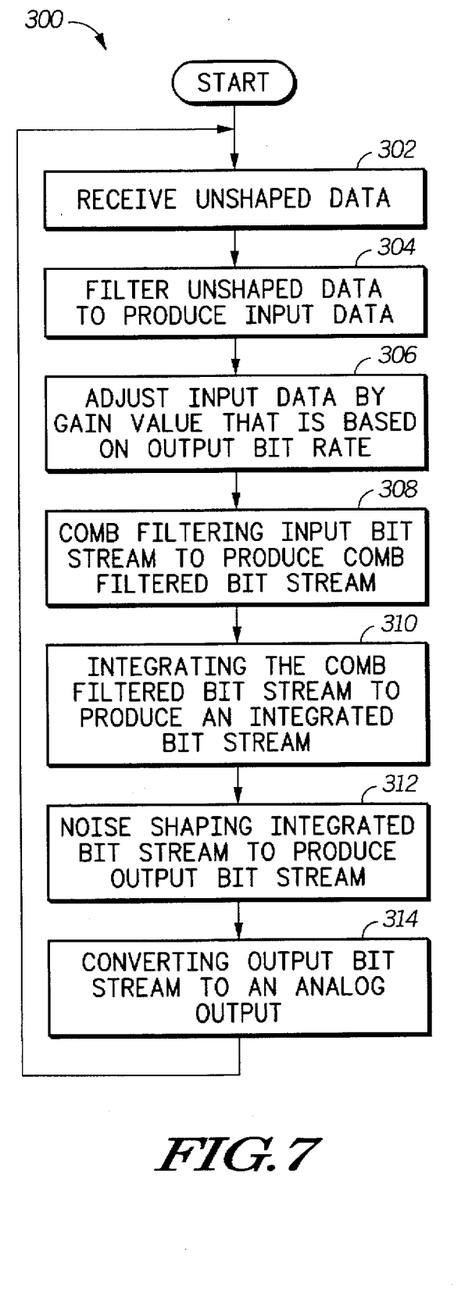
FIG. 7 is a logic diagram illustrating an alternative method of data conversion in accordance with the present invention.

FIG. 7 illustrates an alternative method 300 for converting data at variable sampling rates. As compared to the method 250 of FIG. 6, the method 300 of FIG. 7 converts data from a higher data width, lower sampling frequency to a narrower data width, higher sampling frequency signal and in one embodiment converts an analog signal. Preferably, the method 300 of FIG. 7 is consistent with the data converters 150 and 200 of FIGS. 4 and 5, respectively. Thus, details not discussed in particular with the method 300 of FIG. 7 may be found with respect to the previous discussions of the data converters 150 and 200.

The method 300 commences at step 302 of receiving unshaped data an input bit rate. Next, at step 304, the method includes filtering the unshaped data to produce input data. The filtering preferably includes spectrally shaping the input data to compensate for the affects of integrating and comb filtering as well as the spectral requirements of the particular application.

Next, at step 306, the method 300 includes adjusting the input data by a gain value to produce gain adjusted input data. The gain value will be determined based upon an output data rate, the input data rate, and the order of integration to be performed in step 310. As was previously discussed, a gain of a CIC block is dependent upon the oversampling ratio of the CIC block and the order of the integration performed by the block. Thus, with method step 306, the gain value is dependent upon the input bit rate, the output bit rate, and resultantly, the gain of the CIC block. Therefore, step 306 gain adjusts the input data to compensate for the variable gain of the method 300 in various modes of operation to produce output data within a predetermined dynamic range.

Following step 306, step 308 comb filters the input bit stream to produce a comb filtered bit stream, preferably at an intermediate bit rate greater than the input bit rate. Next, step 310 includes integrating the comb filtered bit stream to produce an integrated bit stream at an output bit rate. Steps 308 and 310 are consistent with the functions performed in conjunction with the data converters 150 and 200 previously described and as are known in the art.

Next, step 312 includes noise shaping the integrated bit stream to produce a noise shaped output bit stream. As is known in the art, noise shaping reduces the data width of a bit stream but introduces quantization noise on the frequency spectrum, generally at frequencies higher than the frequency of interest.

Finally, at step 314, the method 300 includes converting the output bit stream to an analog output. Such data conversion is known in the art and preferably includes a low pass filtering stage for removing the quantization noise from the analog signal.

Thus, the method 300 of the present invention includes the benefit of providing operation at variable sampling rates while producing an output in a predetermined dynamic range. By providing this benefit, power consumption may be reduced as well as the cost of implementing the method 300 in conjunction with a larger system.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A data converter having a variable sampling rate, the data converter comprising:
an input gain stage for receiving an input bit stream at an input bit rate and adjusting the input bit stream by an input gain value to produce a gain adjusted bit stream at the input bit rate, the input gain value at least partially based on the input bit rate;
an integrator operably coupled to the input gain stage for receiving the gain adjusted bit stream and producing therefrom an integrated bit stream at the input bit rate; and
a comb filter operably coupled to the integrator for receiving the integrated bit stream and comb filtering the integrated bit stream to produce a filtered bit stream at an output bit rate, wherein the output bit rate is less than the input bit rate.

2. The data converter of claim 1, further comprising:

a signal shaping filter operably coupled to the comb filter for receiving the filtered bit stream and spectrally shaping the filtered bit stream to produce an output bit stream conforming with spectral requirements.

3. The data converter of claim 2, wherein the signal shaping filter further includes circuitry for producing the output bit stream at a secondary output bit rate, wherein the secondary output bit rate is less than the output bit rate.

4. The data converter of claim 2, further comprising:

a DC offset stage operably coupled between the comb filter and the signal shaping filter for substantially removing a DC component from the filtered bit stream, the DC component at least partially based on the input bit rate.

5. The data converter of claim 2, further comprising:

an output gain stage operably coupled between the comb filter and the signal shaping filter for adjusting a magnitude of the filtered bit stream by an output gain value, wherein the output gain value is at least partially based on the input bit rate.

6. The data converter of claim 1, further comprising circuitry for determining the input gain value based upon the input bit rate and the output bit rate.

7. The data converter of claim 6, wherein the circuitry for determining the input gain value based at least partially upon the input bit rate determines the input gain value based upon a ratio of the input bit rate to the output bit rate.

8. The data converter of claim 1, wherein:

the integrator comprises a multiple bit adder and a multiple bit register interoperably coupled to provide an accumulation function; and wherein the input gain stage comprises a bit selector for routing the input bit stream to one single bit input of a plurality of single bit inputs of the multiple bit adder based on the input gain value.

9. The data converter of claim 8, wherein the comb filter comprises a digital signal processor processing instructions to perform a comb filtering function.

10. The data converter of claim 1, wherein the input bit rate is selected from the group consisting of 960 Khz, 1.024 Mhz, and 1.152 Mhz.

11. The data converter of claim 10, wherein the output bit rate is 16 Khz.

12. The data converter of claim 1, further comprising:

a sigma-delta converter operably coupled to the input gain stage, wherein the sigma-delta converter receives an analog signal and converts the analog signal to produce the input bit stream, wherein the input bit stream comprises a single bit width signal at the input bit rate.

13. A data converter having a variable sampling rate, the data converter comprising:

an input gain stage having an input at an input bit rate and a gain adjusted output at the input bit rate, wherein a gain between the input and the gain adjusted output is at least partially based on the input bit rate;

an integrator having an input operably coupled to the gain adjusted output of the input gain stage and an integrated output at the input bit rate;

a comb filter having an input operably coupled to the integrated output of the integrator and a comb filtered output at an output bit rate, the output bit rate less than the input bit rate;

a DC offset stage having an input operably coupled to the comb filtered output of the comb filter and a DC adjusted output at the output bit rate, wherein a DC component removed from the comb filtered output is at least partially based on the input bit rate; and an output gain stage having an input operably coupled to the DC adjusted output of the DC offset stage and a gain adjusted output at the output bit rate, wherein a gain between the input and the output of the output gain stage is at least partially based on the input bit rate.

14. The data converter of claim 13, further comprising:

a signal shaping filter having an input operably coupled to the gain adjusted output of the output gain stage and an output conforming to spectral requirements.

15. A data converter having a variable sampling rate comprising:

a gain stage for receiving an input bit stream at an input bit rate and adjusting the input bit stream based on a gain value to produce a gain adjusted input bit stream at an input bit rate, the gain value at least partially based on an output bit rate;

a comb filter operably coupled to the gain stage for receiving the gain adjusted input bit stream and comb filtering the integrated bit stream to produce a comb filtered bit stream at an intermediate bit rate, the intermediate bit rate greater than the input bit rate;

an integrator operably coupled to the comb filter for receiving the comb filtered bit stream and producing therefrom an integrated bit stream at an output bit rate, the output bit rate greater than the intermediate bit rate; and a noise shaping filter operably coupled to the integrator for receiving the integrated bit stream and producing a noise shaped output bit stream at the output bit rate.

16. The data converter of claim 15, further comprising:

an input shaping filter for receiving an unshaped input bit stream at the input bit rate and shaping the unshaped input bit stream to produce the input bit stream, the input shaping filter causing the noise shaped output bit stream to conform to spectral requirements.

17. The data converter of claim 15, further comprising:

a digital-to-analog converter operably coupled to the noise shaping filter for receiving the noise shaped output bit stream and converting the noise shaped output bit stream to produce an analog output signal.

18. The data converter of claim 15, further comprising circuitry for determining the gain value based at least partially upon the input bit rate.

19. The data converter of claim 18, wherein the circuitry for determining the gain value determines the gain value based upon a ratio of the input bit rate and the output bit rate.

20. The data converter of claim 15, wherein the comb filter comprises a digital signal processor processing instructions to perform a comb filtering function at the input bit rate.

21. The data converter of claim 15, wherein the output bit rate is selected from the group consisting of 960 Khz, 1.024 Mhz, and 1.152 Mhz.

22. The data converter of claim 21, wherein the input bit rate is 8 Khz.

23. A method for converting analog data to digital data at variable sampling rates, the method comprising the steps of:

(a) receiving an input bit stream at an input bit rate;

(b) adjusting the input bit stream based on an input gain value to produce a gain adjusted bit stream, the input gain value at least partially based on the input bit rate;

(c) integrating the gain adjusted bit stream to produce an integrated bit stream at an output bit rate, wherein the output bit rate is less than the input bit rate; and (d) comb filtering the integrated bit stream to produce a comb filtered bit stream at the output bit rate.

24. The method of claim 23, further comprising the step of:

(e) spectrally shaping the comb filtered bit stream to produce an output bit stream conforming with spectral requirements.

25. The method of claim 24, wherein step (e) includes producing the output bit stream at a secondary output bit rate, the secondary output bit rate is less than the output bit rate.

26. The method of claim 23, further comprising the steps of:

(e) substantially removing a DC component from the comb filtered bit stream, the DC component at least partially based on the input bit rate; and (f) adjusting a magnitude of the comb filtered bit stream by an output gain value that is at least partially based on the input bit rate.

27. The method of claim 26, wherein the input gain value, the DC component, and the output gain value are based upon a ratio of the input bit rate to the output bit rate.

28. A method for converting digital data to analog data at variable sampling rates, the method comprising the steps of:

(a) receiving an input bit stream at an input bit rate;

(b) adjusting the input bit stream based on a gain value to produce a gain adjusted input bit stream, the gain value at least partially based on an output bit rate;

(c) comb filtering the gain adjusted input bit stream to produce a comb filtered bit stream at the output bit rate, the output bit rate greater than the input bit rate;

(d) integrating the comb filtered bit stream to produce an integrated bit stream at the output bit rate; and (e) noise shaping the integrated bit stream to produce a noise shaped output bit stream at the output bit rate.

29. The method of claim 28, further comprising the steps of:

(f) receiving an unshaped input bit stream at the input bit rate; and (g) shaping the unshaped input bit stream to produce the input bit stream.

30. The method of claim 28, further comprising the step of:

(f) converting the noise shaped output bit stream to produce an analog output.

31. The method of claim 28, wherein the gain value is based upon a ratio of the input bit rate to the output bit rate.

* * * * *